(12) United States Patent
Hetzler

(10) Patent No.: US 7,170,295 B2
(45) Date of Patent: Jan. 30, 2007

(54) RESISTOR ARRANGEMENT, MANUFACTURING METHOD, AND MEASUREMENT CIRCUIT

(75) Inventor: Ullrich Hetzler, Dillenburg-Oberscheld (DE)

(73) Assignee: Isabellenhutte Heusler GmbH & Co. KG, Dillenburg (DE)

( * ) Notice: Subject to any disclaimer, the term of this patent is extended or adjusted under 35 U.S.C. 154(b) by 256 days.

(21) Appl. No.: 10/872,890

(22) Filed: Jun. 21, 2004

(65) Prior Publication Data

US 2004/0263150 A1 Dec. 30, 2004

(30) Foreign Application Priority Data

Jun. 26, 2003 (DE) ................. 103 28 870

(51) Int. Cl.
*G01R 1/20* (2006.01)
*H01C 7/00* (2006.01)
*H01C 17/00* (2006.01)

(52) U.S. Cl. ............... 324/522; 324/126; 338/49; 29/610.1

(58) Field of Classification Search ........... 324/504, 324/522, 526, 771–772, 126, 548; 338/49
See application file for complete search history.

(56) References Cited

U.S. PATENT DOCUMENTS

| | | | | |
|---|---|---|---|---|
| 2,708,701 A | * | 5/1955 | Viola | ............... 338/49 |
| 3,245,021 A | * | 4/1966 | Kernander et al. | ....... 338/49 |
| 3,252,091 A | * | 5/1966 | Morgan | ............... 324/126 |
| 3,691,503 A | * | 9/1972 | Battle et al. | ............... 338/95 |
| 4,211,934 A | | 7/1980 | Henle et al. | |
| 4,973,937 A | * | 11/1990 | Weinstein et al. | ........... 338/49 |
| 5,172,062 A | * | 12/1992 | Eisermann | .......... 324/503 |
| 5,563,572 A | | 10/1996 | Hetzler | |
| 5,604,477 A | | 2/1997 | Rainer et al. | |
| 5,703,561 A | | 12/1997 | Yamamoto et al. | |
| 6,489,693 B1 | | 12/2002 | Hetzler | |
| 6,727,680 B2 | * | 4/2004 | Hoffman | ............. 323/269 |
| 2006/0091991 A1 | * | 5/2006 | Wohlgenannt et al. | ....... 338/13 |

FOREIGN PATENT DOCUMENTS

| | | |
|---|---|---|
| DE | 26 34 743 | 1/1978 |
| DE | 3741525 | 6/1989 |
| DE | 4243349 | 6/1994 |
| DE | 29616313 | 1/1997 |
| DE | 19638288 | 3/1998 |
| DE | 19906276 | 9/2000 |
| DE | 20117650 | 4/2003 |
| EP | 449729 A2 * | 10/1991 |
| EP | 0572311 A1 * | 5/1993 |
| EP | 0605800 | 7/1994 |
| EP | 0716427 | 6/1996 |
| EP | 1313109 | 5/2003 |
| GB | 1587551 | 4/1981 |

* cited by examiner

*Primary Examiner*—Anjan Deb
(74) *Attorney, Agent, or Firm*—IpHorgan Ltd.; Vangelis Economou

(57) ABSTRACT

The invention relates to a resistor arrangement, especially for current measurement in a vehicle electrical system, with two plate-shaped connection elements separated from each other and a plate-shaped first resistive element, which is arranged between the two connection elements and is electrically and mechanically connected to these elements. According to the invention, at least one of the other plate-shaped resistive elements, which are separated from the first resistive element and which are arranged between one of the two connection elements of the first resistive element and another connection element is connected electrically and mechanically to these connection elements.

28 Claims, 9 Drawing Sheets

RESISTOR ARRANGEMENT, MANUFACTURING METHOD, AND MEASUREMENT CIRCUIT

BACKGROUND OF THE INVENTION

1. Field of the Invention

Figure 1:
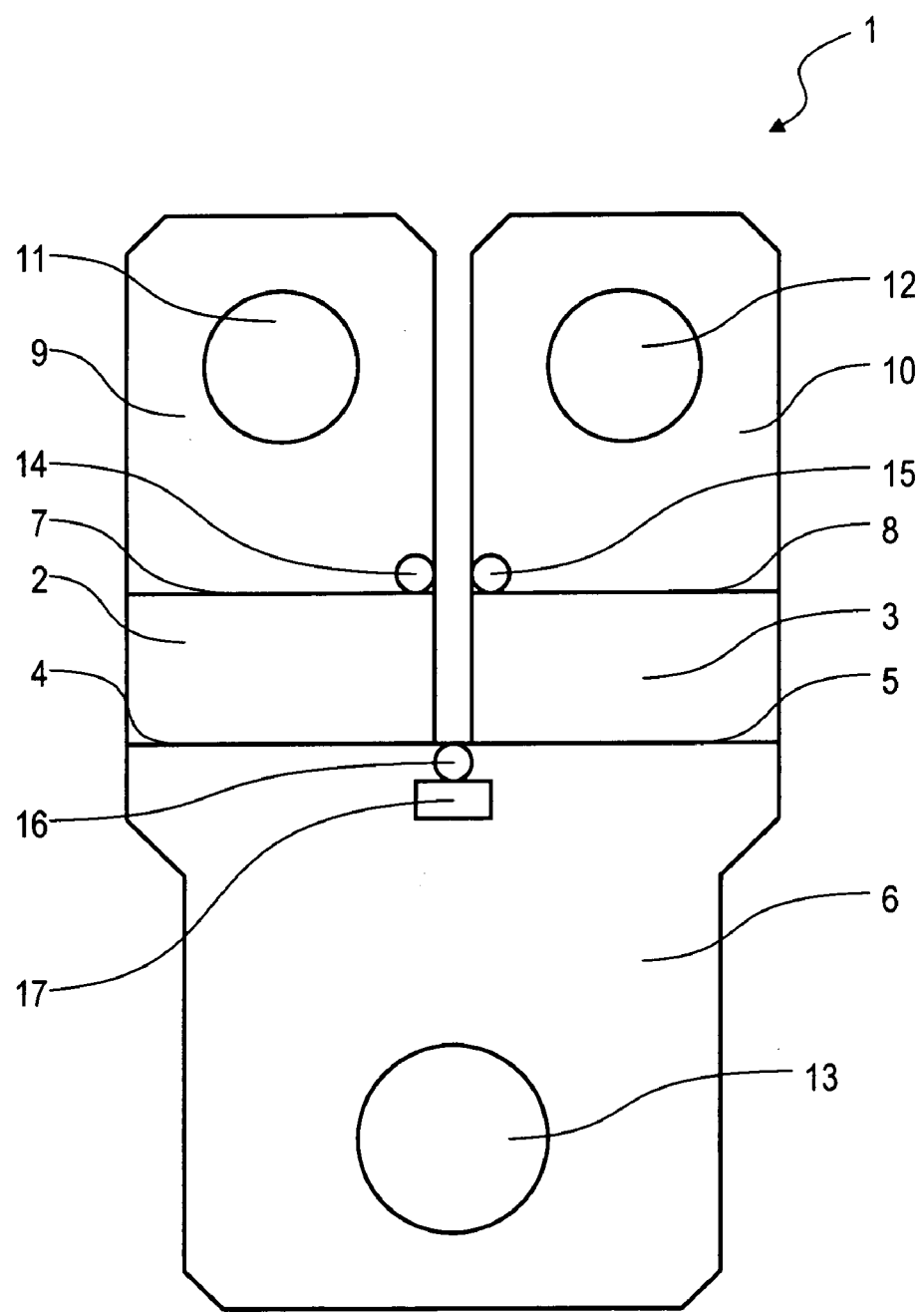

The invention pertains generally to a resistor arrangement, and more particularly for current measurement in a vehicle electrical system, and to a method for producing such a resistor arrangement and also to a measurement circuit with such a resistor arrangement.

2. Background Art

Low-impedance resistor arrangements, which can be used for measuring large currents, are known from EP 0 605 800 B1, U.S. Pat. Nos. 6,489,693, and 5,604,477. These known resistor arrangements consist of two connection elements, which are separated from each other and which are at least partially plate shaped, for supplying or transferring current and a plate-shaped resistive element, which is arranged between the two connection elements and which is electrically and mechanically connected to these connection elements, wherein the resistive element is connected to the adjacent connection elements by welding. The known resistor arrangement further has two separate measurement connections in order to measure the electric voltage drop across the resistive element according to known four-wire technology, wherein the electric current flowing through the resistive element can be calculated according to Ohm's law.

However, a disadvantage in this known resistor arrangement is the fact that to measure several currents, a corresponding number of resistor arrangements are required as well as separated electronic measuring circuits.

SUMMARY OF THE INVENTION

Therefore, the invention is based on the problem of reducing the cost of manufacturing while providing a measuring system for measuring several different electric currents.

This problem is solved, starting from the known resistor arrangements and as described in the introduction, by the characterizing features and, corresponding manufacturing method, and by a measurement circuit, respectively, as described and claimed herein below.

The invention comprises the general technical teaching of improving known resistor arrangements described in the introduction, to the effect that several different electric currents can be measured, in that there are several resistive elements separated from each other and which can each carry an electric current.

In the preferred embodiments of the invention, the resistor arrangement according to the invention has two resistive elements, which are separated from each other, so that two electric currents can be measured simultaneously.

However, it is also possible and is within the scope of the invention to provide the resistor arrangement with more than two (e.g., four) resistive elements, which are separated from each other, in order to be able to measure a corresponding number of electric currents.

The individual resistive elements can also have different widths and/or thickness values with reference to the direction of current flow, as desired, so as to accommodate the appropriate current load.

Preferably, the individual resistive elements are hereby connected to each other in the form of a star independently of the number of resistive elements and are electrically connected by a common connection element, while the other electrical connection of individual resistive elements is realized by a separate connection element.

It should be mentioned here that the resistive elements, on the one hand, and the connection elements on the other, are originally preferably separate components, which, however, are integrally joined to each other in the resistor arrangement according to the present invention. This enables a separate optimization of the connection elements and the resistive elements in terms of their material composition for providing their corresponding function.

Furthermore, the resistor arrangement according to the present invention is preferably fork-shaped, wherein the individual resistive elements are arranged one next to the other and preferably extend in a line. The common connection element of the resistor arrangement here preferably lies on one side of the line of resistive elements, while the other connection elements lie on the opposite side of the line of connection elements. Also a double sided arrangement is possible with the common connector in the middle and resistors on both sides (made of Cu-Manganin®-Cu-Manganin®-Cu for example). The advantage may be a smaller size.

During operation, the resistive elements each carry an electric current along a current path, wherein the current path within the individual resistive elements is preferably essentially shorter than the resistive element according to the invention. Thus, the electrical resistance of the resistive elements is preferably not increased by a meander-shaped or spiral-shaped guidance of the resistive elements. Instead, the resistive elements are preferably plate-shaped, which prevents or at least makes less likely, an effect on the resistance and thus the measurement accuracy by shape changes.

The actual measurement of the electric voltage drop across the individual resistive elements is realized preferably corresponding to the known four-wire technology by measurement connections, which are electrically and mechanically connected to the individual connection elements.

Here, the individual measurement connections are preferably arranged directly at the edges of the resistive elements, so that the voltage measurement is not rendered inaccurate by the electric voltage drop within the connection elements.

In addition, the measurement connections within the connection elements of the resistor arrangement according to the invention directly contact the side edges of the connection elements, which is likewise advantageous in terms of measurement.

In a preferred embodiment of the invention, a circuit board with a measurement circuit is also provided, wherein the circuit board is arranged with its main plane parallel to the main surfaces of the plate-shaped resistive elements and is mechanically and/or electrically connected to these elements. The resistor arrangement according to the invention here forms a single structural unit with the circuit board with the measurement circuit, wherein the influence of electromagnetic interference and thermal stress is minimized by a minimal distance between the resistor arrangement and the circuit board.

The mechanical connection of the circuit board to the resistor arrangement can be realized, e.g., by the measurement connections, by connecting the circuit board to the resistor arrangement by means of a soldering process.

However, alternatively, it is also possible to connect the circuit board mechanically to the resistor arrangement with a spacer, wherein the spacer enables an equalization of mechanical-thermal expansions.

In addition, preferably, there is a through-hole in the common connection element of the individual resistive elements in order to selectively influence the current distribution in the common connection element.

The through-hole can be, e.g., a rectangular recess, wherein the through-hole is preferably directly adjacent to the measurement connection in the common connection element.

For a fork-shaped formation of the resistor arrangement according to the invention, the through-hole is preferably arranged in the center between the two resistive elements for influencing the current distribution.

The mechanical connection between the connection elements and the resistive elements is realized preferably by welding, but the invention can also be realized in terms of the connection between the connection elements and the resistive elements with other integral joining methods, such as hard-soldering.

It should further be mentioned that the connection elements for current transfer or supply preferably consist of copper or a similar conductive copper composition, while the low-impedance resistive elements preferably consist of a CuMnNi composition (also known commercially as Manganin®). The connection elements and the resistive elements thus preferably consist of different materials for the resistor arrangement according to the invention, which preferably exhibit different specific electrical resistance values.

Resistors, which lie in the range between 1 µΩ and 1 mΩ, are suitable for low-impedance current measurement. However, the invention is not limited to the previously mentioned value range in terms of the resistance value of the resistive elements.

In addition, the invention also comprises an advantageous method for producing a resistor arrangement according to the invention, which is described briefly in the following.

First, in a known way the manufacturing method according to the invention ensures that an elongated band made from a resistor material is mechanically and electrically connected at its longitudinal edges to an elongated band made from electrically conductive material, wherein the connection can be realized, e.g., by electron-beam welding.

Then the bands connected to each other are separated along several perpendicular bands into several resistor arrangements.

Here, it is of particular importance that in the individual resistor arrangements between every two adjacent separating lines perpendicular recesses are generated, wherein the recesses extend from a longitudinal edge of the resistor arrangement starting inwards at least up to the band made from the resistive material in order to form two connection elements separated from each other.

The generation of the recesses for forming the elements separated from each other can be realized selectively before the separation of the individual resistor arrangements or after their separation.

In a preferred embodiment of the invention, these perpendicular recesses extend inwards even up to the opposite band made from the electrically conductive material in order to form two resistive elements separated from each other. In this embodiment of the invention, the two resistive elements of one resistor arrangement are thus completely spatially separated from each other and are electrically connected to each other only by the common connection element.

The separating lines for separating the individual resistor arrangements and the recesses for separating the individual connection elements or resistive elements into the individual resistor arrangements are preferably stamped out, but in principle it is also possible to use other manufacturing methods for this purpose.

Finally, the invention also comprises a measurement circuit with at least one resistor arrangement according to the invention, wherein this measurement circuit is especially suited for current measurement in a vehicle electrical system.

Here, the resistor arrangement according to the invention can be arbitrarily connected on the ground side ("low side") or voltage side ("high side"), but it is also possible to provide a resistor arrangement on both the ground side and the voltage side.

For the use of the resistor arrangement according to the invention for current measurement in a vehicle electrical system, a resistive element can be arranged, e.g., in a battery power circuit, while a different resistive element can be arranged, e.g., in a generator power circuit. In this way, both the battery current and also the generator current can be measured directly, while the vehicle current can be derived from the measured values.

However, it is alternatively also possible that a resistive element be arranged in the battery power circuit of the vehicle electrical system, while the other resistive element measures the vehicle current and is connected to the individual loads. In this case, the resistor arrangement according to the invention enables a direct measurement of the battery current and the vehicle current, while the generator current can be derived from these two measured values.

In each case, the invention enables in a simple way a reliable measured-value detection for combined electronic battery and power management, which is becoming ever more important for guaranteeing the power supply in electrical systems, especially in automobiles with a constantly increasing number of electrical loads.

Instead of composite material that has been electron-beam welded in the described way, the resistor arrangement can also be produced in other ways. For example, it is conceivable to connect two bands consisting of the resistor alloy or of copper in a known way by roll-cladding and to generate the resistive elements through partial removal, especially milling, of the copper layer. The shaping and forming of individual pieces of the desired resistor arrangements can also be realized here, e.g., through stamping.

BRIEF DESCRIPTION OF THE DRAWING FIGURES

Figure 2:
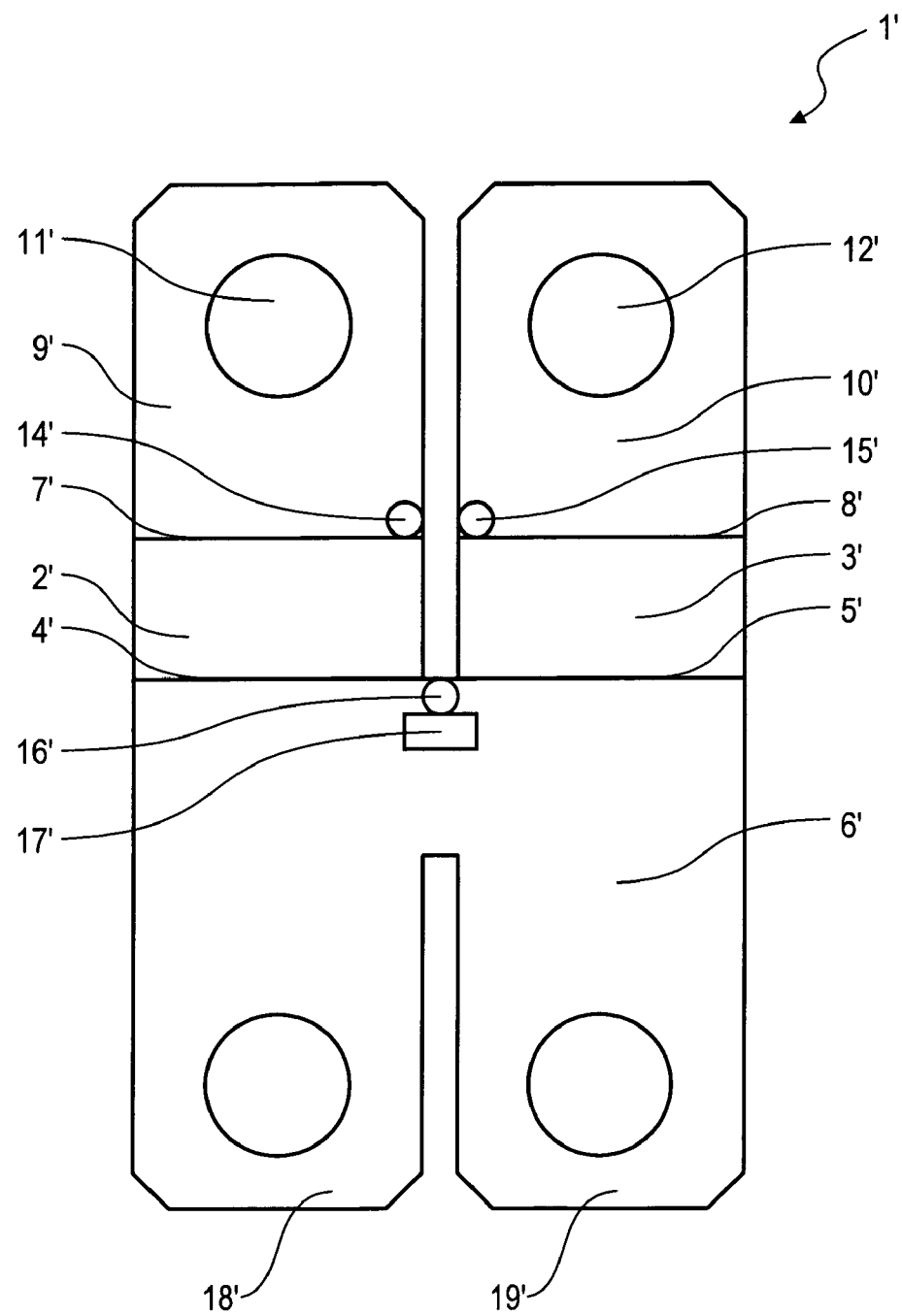
Figure 3:
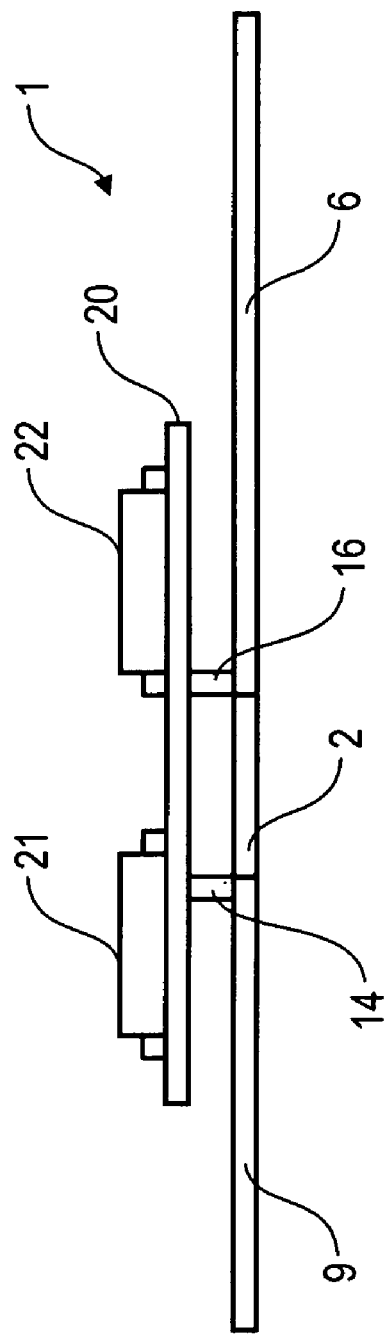
Figure 4:
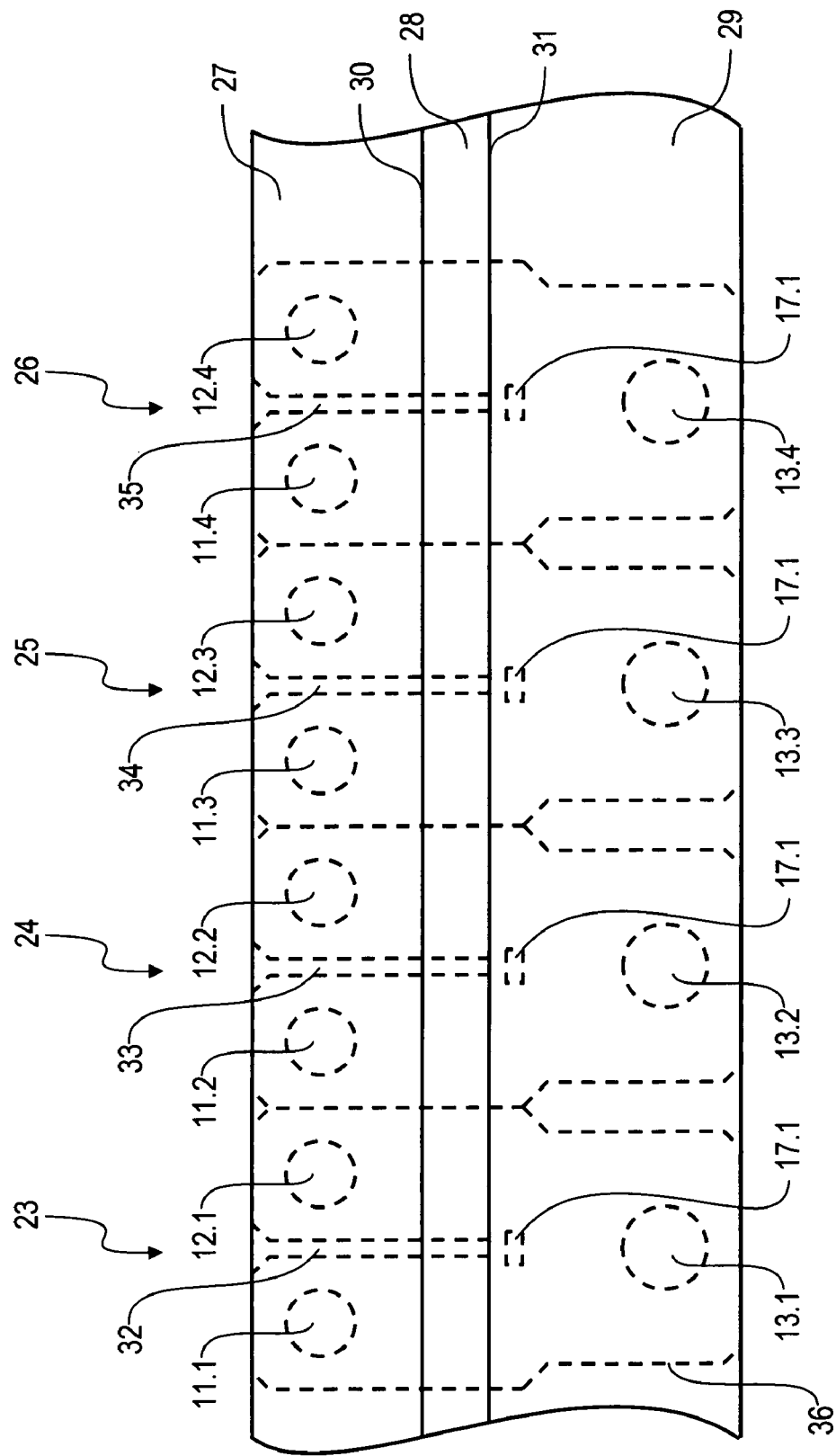
Figure 5:
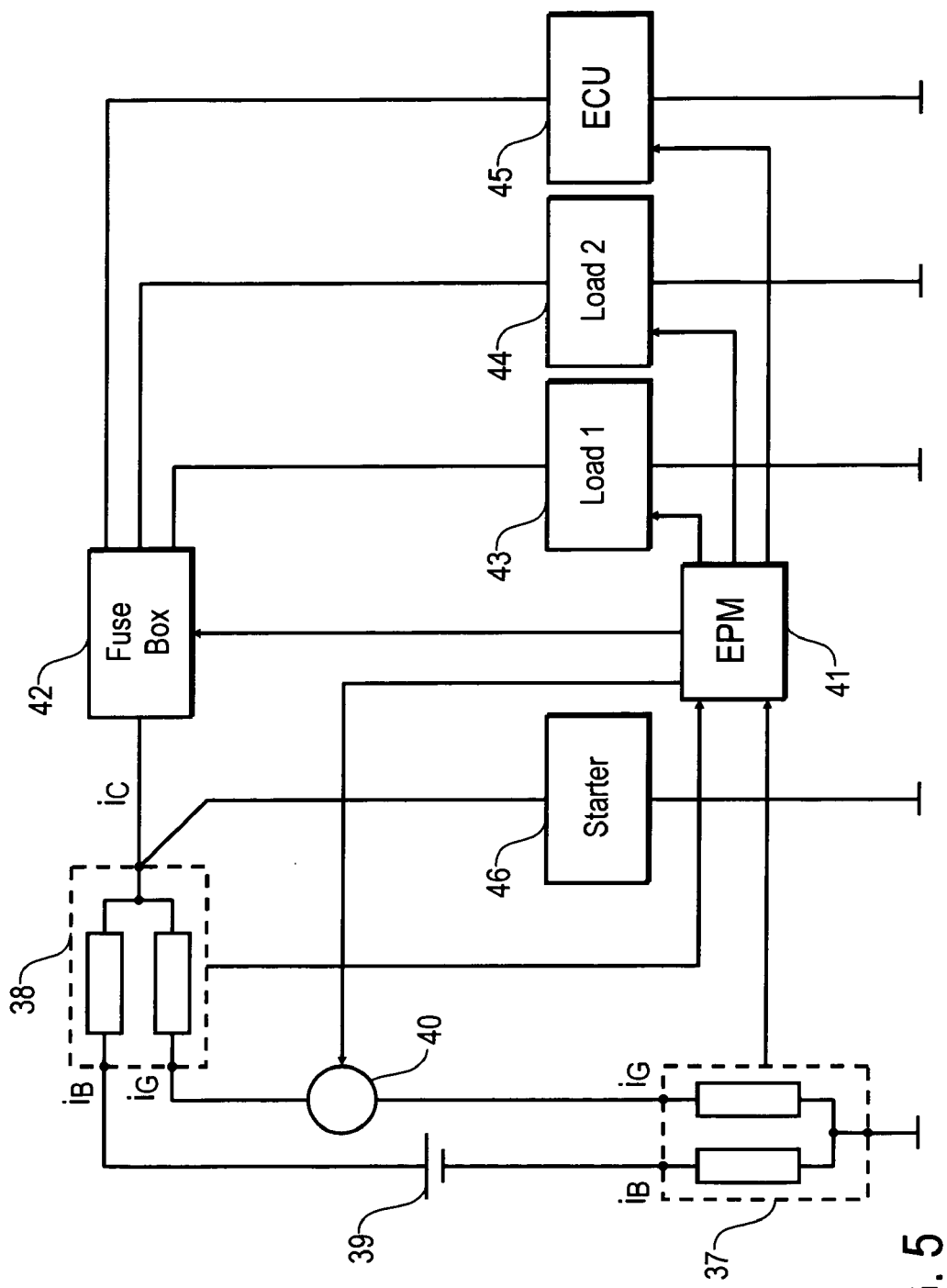
Figure 6:
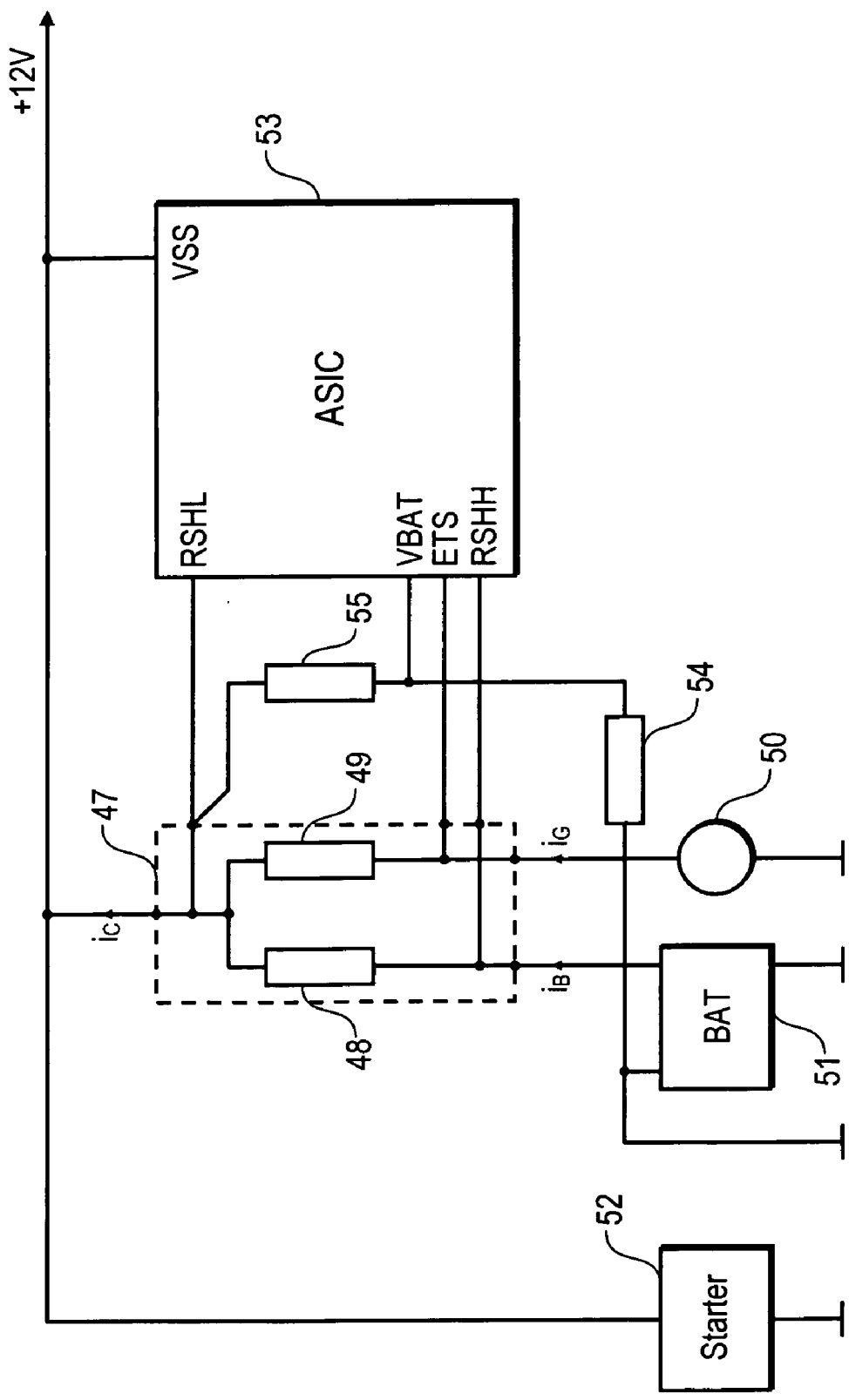
Figure 7A:
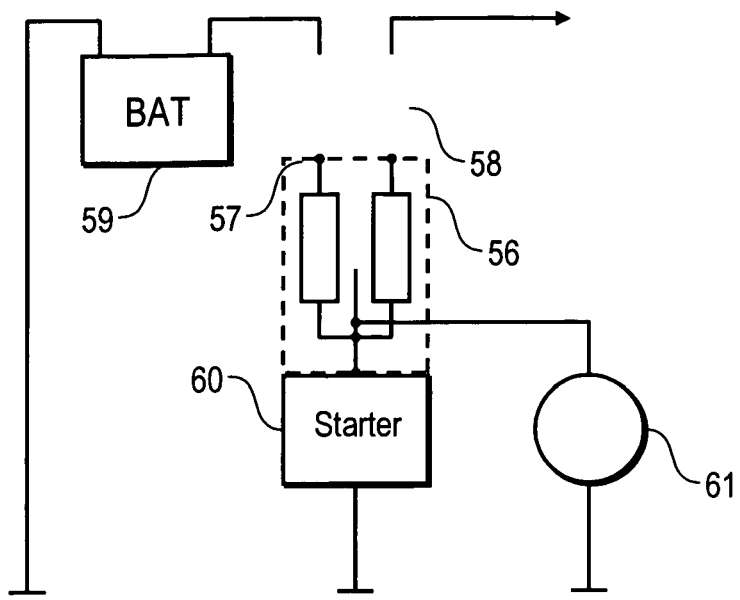
Figure 7B:
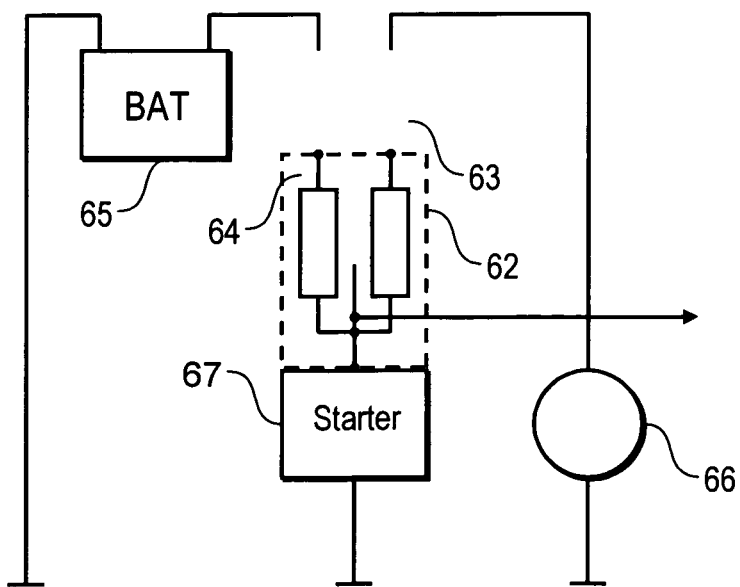
Figure 7C:
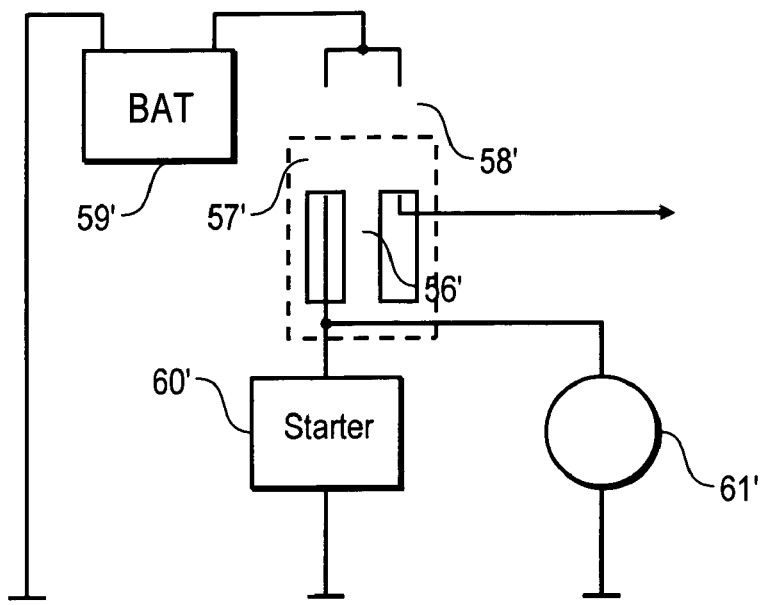
Figure 7D:
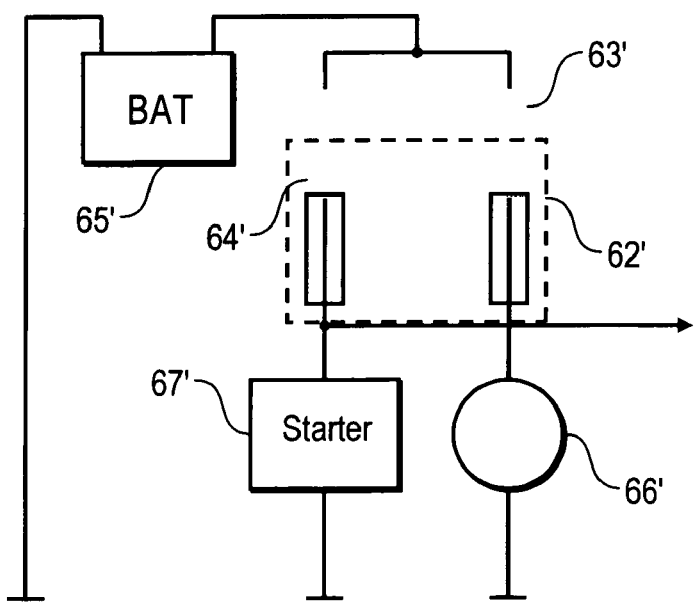
Figure 8:
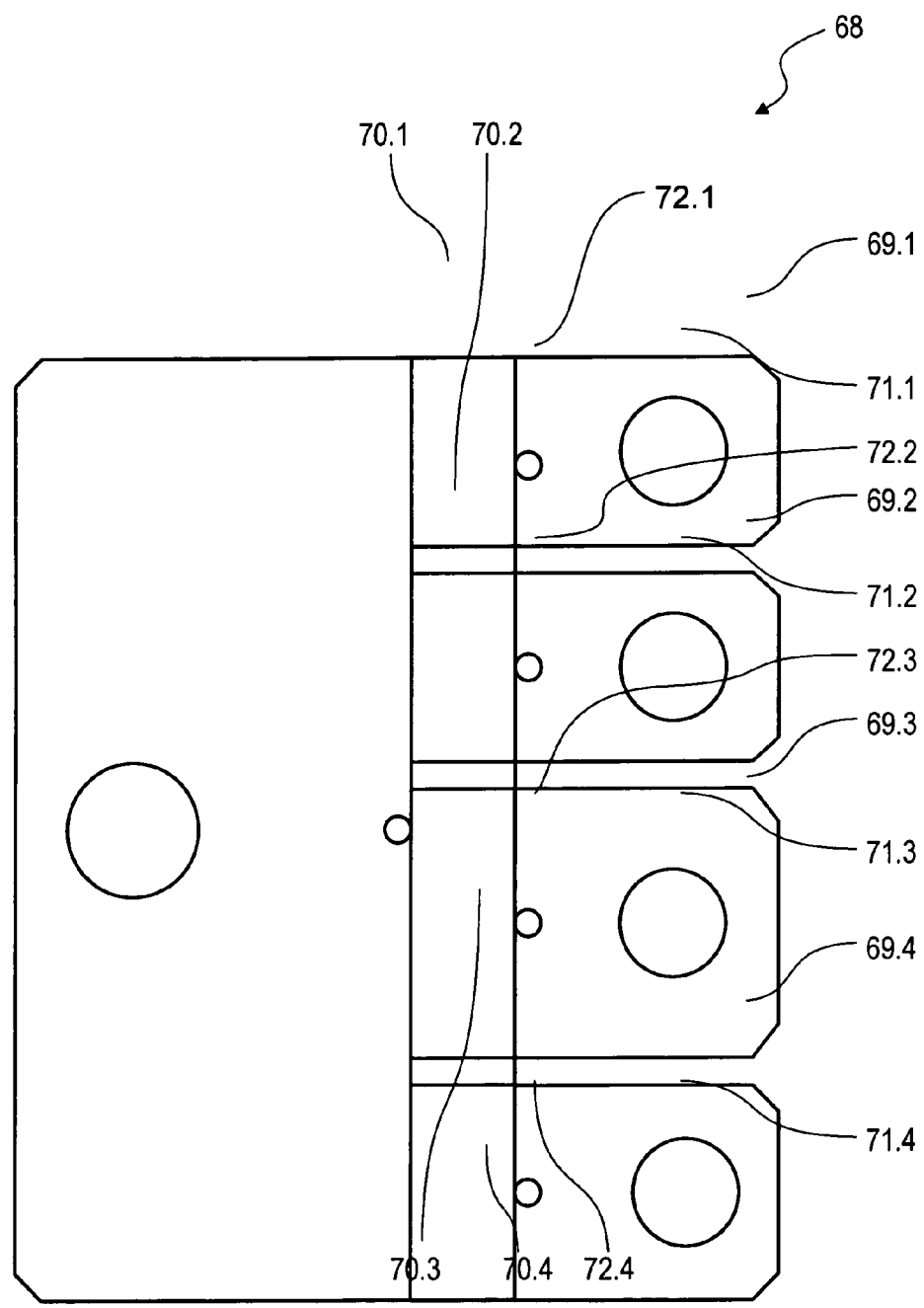

Other advantageous refinements of the invention are further disclosed or are explained in more detail in the following disclosure together with the description of the preferred embodiments of the invention with reference to the drawing figures;

FIG. 1, is a plan view of a resistor arrangement according to the present invention, FIG. 2, is a plan view of an alternative embodiment of a resistor arrangement according to the present invention, FIG. 3, is a side view of the resistor arrangement of FIG. 1 showing a circuit board with a measurement circuit, FIG. 4, is a view of several arrangements according to the invention in the pre-fabricated state during production, FIG. 5, is a measurement circuit diagram according having two resistor arrangements according to the present invention, FIG. 6, is an alternative embodiment of a measurement circuit diagram according to the present invention, FIGS. 7a–7d, are simplified embodiments of measurement circuit diagrams according to the present invention, as well as FIG. 8, is another embodiment of a resistor arrangement according to the present invention having four resistive elements.

DETAILED DESCRIPTION OF THE PREFERRED EMBODIMENTS

The diagram in FIG. 1 shows a resistor arrangement 1 according to the present invention, which can be used, e.g., in a vehicle electrical system, for measuring the generator current and the battery current, as will be described in more detail later.

Here, the resistor arrangement 1 has two resistive elements 2, 3, which are spatially separated from each other and which each consist of a copper alloy (e.g., Manganin®) and exhibit a resistance of, e.g., 100 µΩ.

The two resistive elements 2, 3 are each connected via a welding seam 4, 5 respectively to a common connection element 6, which consists of copper and is used for current transfer or supply.

The two resistive elements 2, 3 are further connected via another welding seam 7, 8 each to a separate connection element 9 and 10, respectively, wherein the two connection elements 9, 10 enable separate current supply or current transfer.

For contacting the connection elements 6, 9, 10, each of these has a current connection hole 11, 12, and 13, respectively.

Here, the actual current measurement is realized according to known four-wire technology through measurement connections 14, 15, 16, which are connected to the connection elements 6, 9, and 10, respectively. By measuring the electric voltage between the two measurement connections 14 and 16, e.g., the electric current flowing through the resistive element 2 can be determined, while the electric voltage between the measurement connections 15 and 16 gives the electric current through the resistive element 3.

The measurement connections 14, 15, 16 are here arranged directly adjacent to the resistive elements 2, 3 in order to prevent measurement errors due to the electric voltage drop within the connection elements 6, 9, 10.

In addition, the measurement connections 14, 15, 16 are arranged directly on the side edges of the connection elements 6, 9, 10 according to the diagram, which is also advantageous in terms of measurement.

The resistor arrangement 1 in the connection element 6 further has a through-hole 17, which borders directly on the measurement connection 16 and selectively influences the current distribution in the connection element 6.

The alternative embodiment shown in FIG. 2 of a resistor arrangement 1' according to the invention agrees largely with the previously described embodiment of the resistor arrangement 1 shown in FIG. 1, so that in the following, mainly to prevent repetition, reference is made to the previous description of the FIG. 1 embodiment and the same reference symbols are used for corresponding parts, which are characterized by an apostrophe only to provide for differentiation.

A characteristic of this embodiment is that the common connection element 6' has two separate contacts 18', 19' for current transfer.

From the side view in FIG. 3 it can be further seen that the resistor arrangement 1 shown in FIG. 1 is connected to a circuit board 20, wherein the circuit board 20 carries a measurement circuit using the SMD construction method. For simplification, here two SMD components 21, 22 of the measurement circuit are shown only as examples.

The mechanical and electrical connection of the circuit board 20 with the resistor arrangement 1 is here realized by the measurement connections 14, 15, and 16, wherein the small distance between the circuit board 20 and the resistor arrangement 1 ensures that the influence of electromagnetic interference and thermal stress remains minimal.

FIG. 4 shows a view of several resistor arrangements 23–26 of the type shown in FIG. 1, but which are shown in the pre-fabricated state.

For the production of the resistor arrangements 23–26, initially three elongated bands 27, 28, 29 are connected to each other along their longitudinal edges via welding seams 30, 31, wherein the two outer bands 27, 29 consist of copper, while the center band 28 consists of the above-mentioned copper alloy and later forms the resistive elements 2, 3 of the individual resistor arrangements 23–26.

After welding the bands 27–29 together, perpendicular recesses 32–35, which extend from the side edge of the band 27 starting inwards up to the welding seam 31, are stamped out in the still stuck-together resistor arrangements 23–26, so that the recesses 32–35 in the resistor arrangements 23–26 separate the connection elements 9 and 10 and also the resistor arrangements 2 and 3 from each other.

In addition, recesses 11.1–11.4, 12.1–12.4, and 13.1–13.4, which are used for connecting separate lines, are stamped out in the individual resistor arrangements 23–26.

Additional through-holes 17.1–17.4 are further stamped out in the individual resistor arrangements 23–26, wherein the through holes 17.1–17.4 are used for influencing the current distribution in the resistor arrangements.

Finally, the individual resistor arrangements are then separated along given separating lines 36, in order to be able to then mount the circuit board 20 shown in FIG. 3 with the measurement circuit.

FIG. 5 shows a measurement circuit, which is used by means of two resistor arrangements 37, 38 according to the invention for current measurement in a vehicle electrical system.

Here, the resistor arrangement 37 is arranged on the ground side ("low side"), wherein a resistive element of the resistor arrangement 37 is arranged in the power circuit of a battery 39, while the other resistive element of the resistor arrangement 37 is arranged in the power circuit of a generator 40. The resistor arrangement 37 thus enables a measurement both of a battery current $i_B$ and also a generator current $i_G$, wherein a vehicle current $i_C$ is given from the negative sum of the two partial currents $i_B$ and $i_G$.

The other resistor arrangement 38 also enables a measurement of the partial currents $i_B$ and $i_G$, because an element of the resistor arrangement 38 is arranged in the power circuit of the battery 39, while the other resistive element of the resistor arrangement 38 is arranged in the power circuit of the generator 40.

The currents captured at the two resistor arrangements 37, 38 are supplied (here shown only simplified) to a monitoring unit 41 (EPM—Electronic Power Management), which controls a fuse box 42, several loads 43, 44 and also an electronic control unit 45 (ECU) of a motor vehicle as a function of the measured values.

Furthermore, a starter 46 is shown, which is connected to the summing node of the resistor arrangement 38.

The resistor arrangements 37, 38 according to the present invention here advantageously enable the measurement of the battery current $i_B$ and the generator current $i_G$, from which the vehicle current $i_C$ can be derived.

The circuit diagram in FIG. 6 shows an alternative embodiment of a measurement circuit according to the invention, for which for current measurement a resistor arrangement 47 with two resistive elements 48, 49 is also used.

Here, the resistive element 49 is arranged in a circuit branch with a generator 50 and thus enables a measurement of a generator current $i_G$.

In contrast, the other resistive element 48 is arranged in a circuit branch in common with a battery 51 and thus enables the measurement of a battery current $i_B$.

For this embodiment, the resistor arrangement 47 according to the invention is arranged on the voltage side ("high side") relative to the generator 50 and the battery 51.

On the common connection element of the resistor arrangement 47 according to the invention, a starter 52 and also several electrical loads are connected, wherein the loads are not shown for simplification.

The actual current measurement is here realized by an integrated circuit 53 (ASIC—Application Specific Integrated Circuit), which is described in detail, e.g., in U.S. Published Application No. 2003/0222511. The contents of this publications are thus to be incorporated herein to their full extent by reference in the present description in terms of the construction and the method of operation of the integrated circuit 53, so that a detailed description of the integrated circuit 53 can be omitted.

However, it should also be mentioned that the integrated circuit 53 has a measurement input VBAT, to which a voltage divider is connected, which consists of two resistors 54, 55, wherein the resistor 54 is connected to ground, while the resistor 55 is connected on the voltage side to the vehicle power supply voltage.

Furthermore, the integrated circuit 53 has a voltage-side voltage tap RSHL, which is connected to the common connection element of the resistor arrangement 47.

In contrast, the two other connection elements of the resistor arrangement 47 are each separately connected to another measurement input ETS or RSHH of the integrated circuit 53.

FIGS. 7a–7d show simple embodiments of alternative modifications of measurement circuits according to the present invention, wherein the following described measurement circuit is illustrated.

Here, a resistor arrangement 56 according to the invention is likewise used with two resistive elements 57, 58, wherein the resistive element 57 is arranged in a circuit branch in common with a battery 59.

In contrast, the resistive element 58 of the resistor arrangement 56 is arranged in another circuit branch, via which all of the loads of the vehicle electrical system are supplied with power.

Here, a starter 60 and a generator 61 are connected to the common connection element of the resistor arrangement 56.

The resistor arrangement 56 is likewise arranged on the voltage side in this embodiment.

The embodiment of a measurement circuit according to the invention shown in FIG. 7b likewise has a resistor arrangement 62 according to the invention with two resistive elements 63, 64, where the resistive element 64 is arranged in turn in a circuit branch in common with a battery 65.

In contrast, the other resistive element 63 is arranged in common with a generator 66.

In this embodiment, the battery current and the generator current can be measured directly, while the vehicle current is derived from these two measured values.

Here, a starter 67 and a tap for supplying the vehicle electrical system is connected to the common connection of the resistor arrangement 62 according to the invention.

The embodiments in FIGS. 7c and 7d are similar to the embodiments in FIGS. 7a and 7b, so that in the following, to prevent repetition, reference is made to the previous description and the same reference symbols are used for corresponding components, which are further characterized by an apostrophe merely for differentiation.

A characteristic of the embodiment according to FIG. 7c is that a circuit branch is connected to the common connection element of the resistor arrangement 56', in which the battery 59' is located.

In contrast, one of the two separate connection elements of the resistor arrangement 56' is connected to a circuit branch, in which a parallel circuit is arranged from the starter 60' and the generator 61'.

In contrast, the other connection element of the two separate connection elements of the resistor arrangement 56' is connected to a circuit branch in which the vehicle current flows.

For the embodiment according to FIG. 7d, a circuit branch is also connected to the common connection element of the resistor arrangement 62' in which the battery 65' is located.

In contrast, the two separate connection elements of the resistor arrangement 62' are connected to two circuit branches in which the starter 67' or the generator 66' is arranged.

FIG. 8 shows an embodiment of a resistor arrangement 68, which the embodiment shown in FIG. 1, so that to prevent repetition in the following, the previous description of common elements and functions is omitted.

A characteristic of the resistor arrangement 68 is that, overall, four connection elements 69.1–69.4 and, correspondingly, also four resistive elements 70.1–70.4 are provided.

Here, in each of the four connection elements 69.1–69.4, in turn, a current connection hole 71.1–71.4 is arranged.

Finally, a measurement connection 72.1–72.4 is connected to each of the connection elements 69.1–69.4.

The invention is not limited to the previously described preferred embodiments. Instead, a plurality of variants and modifications is possible, which likewise make use of the concept according to the present invention and which thus are intended to fall within the scope of protection of the following claims and their equivalents.

What is claimed is:

1. A resistor arrangement
having two plate-shaped connection elements, separated from each other, and a plate-shaped first resistive element which is arranged between the two connection elements and which is connected to these elements electrically and mechanically,
at least a second plate-shaped resistive element, separated from the first resistive element by a separation recess, arranged between one of the two connection elements connected to the first resistive element and a third connection element, and being connected to one of the two plate-shaped connection elements and to the third connection element electrically and mechanically, wherein one of the two plate-shaped connection elements and the third connection element are coplanar and are separated from each other by a separation recess that is contiguous with the separation recess disposed between the first and second plate-shaped resistive elements.

2. A resistor arrangement according to claim 1, wherein measurement connections are provided for detecting the electric voltage drop across the first and second plate-shaped resistive elements which are connected electrically and mechanically to the individual connection elements.

3. A resistor arrangement according to claim 2, wherein the measurement connections are each arranged directly adjacent to the first and second plate-shaped resistive elements and/or to the side edges of the connection elements.

4. A resistor arrangement according to claim 1, further comprising a circuit board with a measurement circuit, wherein the circuit board is arranged in parallel with the first and second plate-shaped resistive elements and is electrically connected to these elements.

5. A resistor arrangement according to claim 4, wherein the circuit board with the measurement circuit is mechanically connected to the connection elements by the measurement connections.

6. A resistor arrangement according to claim 4, wherein the circuit board with the measurement circuit is mechanically connected via a spacer to the connection elements and/or the resistive elements.

7. A resistor arrangement according to claim 1 wherein one of the two plate-shaped connection elements and the third connection element are each electrically connected through the first and second plate-shaped resistive elements, respectively, to the other of the two plate-shaped connection elements, which is a common connection element, and a through-hole for influencing the current distribution is arranged in the common connection element of the resistive elements.

8. A resistor arrangement according to claim 7, wherein the through-hole is arranged in the center between the two plate-shaped resistive elements.

9. A resistor arrangement according to claim 1 wherein the connection elements are welded to the resistive elements.

10. A resistor arrangement according to claim 1 wherein the connection elements consist of copper or a copper alloy.

11. A resistor arrangement according to claim 1 wherein the resistive elements consist of a CuMnNi alloy.

12. A resistor arrangement according to claim 1 wherein the common connection element of the two resistive elements has two connection contacts for current transfer.

13. A method of manufacturing resistor arrangements comprising the following steps:
mechanically and electrically connecting an elongated band made from a resistive material on its longitudinal edges to an elongated band made from an electrically conductive material,
separating the bands connected to each other into several resistor arrangements along several perpendicular separating lines,
generating in the individual resistor arrangements perpendicular recesses between two adjacent separating lines, wherein the recesses extend from a longitudinal edge of the resistor arrangements starting inwards at least up to the band made from the resistor material in order to form two connection elements separated from each other.

14. The manufacturing method according to claim 13, wherein the perpendicular recesses extend inwards at least up to the opposite band made from electrically conductive material in order to form two resistive elements separated from each other.

15. The manufacturing method according to claim 14 wherein the generating step for generating the recesses and/or the separating lines further comprises stamping.

16. The manufacturing method according to claim 13 wherein the generating step for generating the recesses and/or the separating lines further comprises stamping.

17. The manufacturing method according to claim 13 wherein the bands are welded to each other.

18. The manufacturing method according to claim 13 wherein the individual resistor arrangements are connected to an integrated measurement circuit electrically and/or mechanically.

19. A measurement circuit comprising:
a first resistive element arranged in a first circuit branch,
a first voltage tap for measuring the electric voltage drop across the first resistive element,
a second resistive element arranged in a second circuit branch separated from the first resistive element by a separation recess, and
a second voltage tap for measuring the electric voltage drop across the second resistive element,
wherein the two resistive elements are arranged in common in a resistor arrangement and are connected mechanically to each other by a common connection to a plate-shaped common connection element at one of their ends, and to a first and second connection element, respectively, at the opposite end from the connection of the resistive element to the common connection element.

20. The measurement circuit according to claim 19, wherein the two resistive elements are connected mechanically to each other through the common connection element for current transfer and/or supply, and are disposed on the same side of the common connection element.

21. The measurement circuit according to claim 20, further comprising third circuit branch having a starter connected to the common connection element.

22. The measurement circuit according to claim 20, wherein a third circuit branch having a battery is connected to the common connection element.

23. The measurement circuit according to claim 22, wherein a starter is arranged in the first circuit branch and a generator is arranged in the second circuit branch.

24. The measurement circuit according to claim 22, wherein a parallel circuit made up of a starter and a generator are arranged in the first circuit branch, while at least one load is arranged in the second circuit branch.

25. The measurement circuit according to claim 19 wherein a battery is arranged in the first circuit branch and at least one load is arranged in the second circuit branch.

26. The measurement circuit according to claim 19 wherein a battery is arranged in the first circuit branch and a generator is arranged in the second circuit branch.

27. The measurement circuit according to claim 19 wherein the resistor arrangement is connected on the ground side.

28. The measurement circuit according to claim 19 wherein the resistor arrangement is connected on the voltage side.

* * * * *